US012501777B2

(12) United States Patent
Han et al.

(10) Patent No.: US 12,501,777 B2
(45) Date of Patent: Dec. 16, 2025

(54) DISPLAY PANEL AND SEMICONDUCTOR DEVICE

(71) Applicant: BOE Technology Group Co., Ltd., Beijing (CN)

(72) Inventors: Ying Han, Beijing (CN); Pan Xu, Beijing (CN); Xing Zhang, Beijing (CN); Donghui Zhao, Beijing (CN); Guangshuang Lv, Beijing (CN); Chengyuan Luo, Beijing (CN); Cheng Xu, Beijing (CN); Hongli Wang, Beijing (CN); Tong Wu, Beijing (CN); Dandan Zhou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/861,840

(22) PCT Filed: Feb. 6, 2024

(86) PCT No.: PCT/CN2024/076361

§ 371 (c)(1),
(2) Date: Oct. 30, 2024

(87) PCT Pub. No.: WO2024/198741

PCT Pub. Date: Oct. 3, 2024

(65) Prior Publication Data

US 2025/0287780 A1 Sep. 11, 2025

(30) Foreign Application Priority Data

Mar. 27, 2023 (CN) ......................... 202310317758.7

(51) Int. Cl.

*G09G 3/3233* (2016.01)
*H10K 59/121* (2023.01)
*H10K 59/131* (2023.01)

(52) U.S. Cl.

CPC ....... *H10K 59/1213* (2023.02); *G09G 3/3233* (2013.01); *H10K 59/131* (2023.02);
(Continued)

(58) Field of Classification Search

CPC ............. H10K 59/1213; H10K 59/131; G09G 3/3233; G09G 2300/0819;
(Continued)

(56) References Cited

U.S. PATENT DOCUMENTS

2021/0376046 A1* 12/2021 Dong .................. H10K 59/124
2022/0328603 A1* 10/2022 Shi ......................... H10K 59/65

FOREIGN PATENT DOCUMENTS

CN 102810292 A 12/2012
CN 105097898 A 11/2015
(Continued)

OTHER PUBLICATIONS

PCT/CN2024/076361 international search report and Written Opinion dated Apr. 26, 2024.

*Primary Examiner* — Robert J Michaud
(74) *Attorney, Agent, or Firm* — IPro, PLLC

(57) ABSTRACT

The present application provides a display panel and a semiconductor device. The display panel is provided with a plurality of pixel light-emitting units and a plurality of driving circuits. An active layer is located on one side of a substrate and comprises a plurality of active regions. A first gate layer comprises a plurality of gates, and there is an overlapping area between the orthographic projections of the gates on the substrate and the orthographic projections of the corresponding active regions on the substrate. A second gate layer is located on the side of the first gate layer distant from the active layer and comprises a shielding layer. A first source-drain electrode layer is located on the side of the
(Continued)

second gate layer distant from the first gate layer, and comprises a plurality of power lines arranged side by side.

14 Claims, 11 Drawing Sheets

(52) U.S. Cl.
CPC .............. *G09G 2300/0426* (2013.01); *G09G 2300/0819* (2013.01); *G09G 2300/0852* (2013.01); *G09G 2310/08* (2013.01); *G09G 2320/0233* (2013.01)

(58) Field of Classification Search
CPC ... G09G 2300/0852; G09G 2300/0426; G09G 2310/08; G09G 2320/0233
See application file for complete search history.

(56) References Cited

FOREIGN PATENT DOCUMENTS

| | | | |
|---|---|---|---|
| CN | 116249401 | A | 6/2023 |
| EP | 3933818 | A1 | 1/2022 |

* cited by examiner

DISPLAY PANEL AND SEMICONDUCTOR DEVICE

CROSS-REFERENCE TO RELATED APPLICATIONS

This application is a national stage of International Application No. PCT/CN2024/076361, filed on Feb. 6, 2024, which claims priority to Chinese Patent Application No. 202310317758.7, filed on Mar. 27, 2023. Both of the aforementioned applications are hereby incorporated by reference in their entireties.

TECHNICAL FIELD

The present disclosure relates to the field of semiconductor manufacturing technologies, and in particular, to a display panel and a semiconductor device.

BACKGROUND

Organic light-emitting diode (OLED) display is a display technology different from conventional liquid crystal display (LCD), and has advantages of active light emission, good temperature characteristics, low power consumption, fast response, flexibility, ultra-thinness, low cost, etc., and has become one of important findings of a new generation of display devices, and has received more and more attention. An OLED display panel includes a plurality of pixel units, each pixel unit includes a pixel driving circuit and a light-emitting element, and the pixel driving circuit are used for outputting driving currents to drive the light-emitting element to emit light. The pixel driving circuit includes at least one thin film transistor (TFT) and at least one capacitor. Arrangement of the thin film transistor and the capacitor in the circuit may cause partial signal overlap, hence affecting stability of the driving currents, which may cause uneven (Mura) brightness of the display panel. In addition, a size of each pixel will also affect a resolution of the display panel, so it is necessary to provide a more compact arrangement for the thin film transistor and the capacitor in the driving circuit to realize high-resolution display of the display panel.

SUMMARY

In view of the disadvantages of the prior arts, the present disclosure provides a display panel and a semiconductor device to solve the problem of uneven brightness caused by signal overlapping in a pixel-driving circuit in the prior arts, so as to provide a display panel with uniform display brightness and ultra-high resolution design to further improve the display effect.

An embodiment of the present disclosure provides a display panel. The display panel includes pixel light-emitting units and driving circuits, where each of the pixel light-emitting units includes an anode, a cathode and a light-emitting material between the anode and the cathode, each of the driving circuits includes a storage capacitor and transistors. The display panel further includes a substrate, an active layer, a first gate layer, a second gate layer, and a first source-drain electrode layer. The active layer is located on a side of the substrate, and includes active regions, the active regions include a fifth active region; the first gate layer includes gate electrodes, where an orthographic projection of each of the gate electrodes on the substrate includes an overlapped region with an orthographic projection of a corresponding active region on the substrate, and the gate electrode and the active region with the overlapped region constitute a part of a same transistor; a region of the active region overlapped with the gate electrode serves as a channel of the transistor, and regions of the active region on two sides of the channel serve as a source region and a drain region of the transistor respectively; where a source region or a drain region of one of the active regions is configured to be electrically connected to the anode of one of the pixel light-emitting units, the gate electrodes at least include a fifth gate electrode, and the fifth gate electrode is configured to correspond to a channel of the fifth active region and is configured to be in a floating state within at least one time period. The second gate layer is located on a side of the first gate layer facing away from the active layer and includes a shielding layer; the first source-drain electrode layer is located on a side of the second gate layer facing away from the first gate layer and includes a plurality of power lines arranged side by side, the power lines are configured to input power signals to gate electrodes, source regions or drain regions of the transistors, at least one of the power lines is an alternating current power line, and an orthographic projection of the alternating current power line on the substrate includes an overlapping region with an orthographic projection of the active region electrically connected to the anode on the substrate; where an orthographic projection of the shielding layer on the substrate covers at least a part of the overlapping region.

As can be learnt from the above embodiments, according to the present disclosure, a partial region of the second gate layer in the driving circuit of the pixel light-emitting unit overlaps with the alternating current power line in the first source-drain electrode layer, so as to achieve signal shielding and noise reduction of the alternating current signal, thereby preventing the potential of the gate electrode in the floating state from being affected to cause sudden change and poor and uneven display (Mura), thereby improving the display light-emitting effect.

In addition, the AC power line overlaps with a part of wiring of the second gate layer, so that a space occupied by each single pixel can be reduced, a space utilization rate can be improved, and an ultra-high-resolution design can be realized.

In an embodiment, an area of the overlapping region covered by the orthographic projection of the shielding layer on the substrate is greater than or equal to 50% of a total area of the overlapping region; or the orthographic projection of the shielding layer on the substrate covers the entire overlapping region.

In an embodiment, the shielding layer serves as a capacitor plate of the storage capacitor and is electrically connected to the anode; and a region of the active layer located in the overlapping region serves as at least a part of another capacitor plate of the storage capacitor.

In an embodiment, the transistors include a first transistor, during a time period, a source region or a drain region of the first transistor is at a same potential as the fifth gate electrode, and an orthographic projection of an active region of the first transistor on the substrate does not overlap with an orthographic projection of the alternating current power line on the substrate.

In an embodiment, the transistors include a second transistor, a source region or a drain region of the second transistor is at a same potential as the fifth gate electrode within a time period, and an orthographic projection of an active region of the second transistor on the substrate does not overlap with the orthographic projection of the alternating current power line on the substrate.

In an embodiment, the display panel further includes: a second source-drain electrode layer, where the second source-drain electrode layer is located on a side of the first source-drain electrode layer facing away from the second gate electrode layer, and includes data lines arranged side by side; and the pixel light-emitting units are located on a side of the second source-drain electrode layer facing away from the first source-drain electrode layer.

In an embodiments, the active region of the transistor where the fifth gate electrode is located extends along a column direction, and the power lines extend along a row direction.

In an embodiment, the driving circuits include a 5T2C type circuit, where the 5T2C type circuit includes a first transistor, a second transistor, a third transistor, a fourth transistor, a fifth transistor, a storage capacitor and a diode capacitor, a source region or a drain region of the first transistor, a source region or a drain region of the second transistor, a gate electrode of the fifth transistor and a capacitor plate of the storage capacitor are all connected to a potential G; another capacitor plate of the storage capacitor, a source region or a drain region of the fifth transistor, a source region or a drain region of the third transistor and the anode are all connected to a potential S; another of the source region or the drain region of the fifth transistor is connected to a source region or a drain region of the fourth transistor; a plate of the diode capacitor is connected to the anode, and another plate of the diode capacitor is connected to the cathode.

In an embodiment, the power lines include a Vref power line, a G2 power line, a Vini power line, a G3 power line, an EM power line, a VDD power line and a G1 power line, where the Vref power line is connected to another of the source region or the drain region of the second transistor, the G2 power line is connected to a gate electrode of the second transistor, the Vini power line is connected to another of the source region or the drain region of the third transistor, the G3 power line is connected to a gate electrode of the third transistor, the EM power line is connected to a gate electrode of the fourth transistor, the VDD power line is connected to another of the source region or the drain region of the fourth transistor, and the G1 power line is connected to a gate electrode of the first transistor.

In an embodiment, the data lines are electrically connected to the driving circuits, where the data lines are in one-to-one correspondence with the driving circuits; or the data lines are in one-to-many correspondence with the driving circuits.

In an embodiment, the display panel further includes a first gate insulating layer disposed between the active layer and the first gate layer, and an interlayer insulating layer disposed between the first source-drain layer and the active layer;

an orthographic projection of the first gate insulating layer on the substrate completely covers the first gate layer.

The embodiments of the present disclosure further provides a semiconductor device, and the semiconductor device includes a substrate, a floating potential layer, an alternating current potential layer and a shielding layer, where the floating potential layer is arranged on one side of the substrate; the alternating current potential layer is connected with an alternating current power and is arranged on a side of the potential floating layer facing away from the substrate, and an orthographic projection of the alternating current potential layer on the substrate includes an overlapping region with an orthographic projection of the floating potential layer on the substrate; and the shielding layer is arranged between the floating potential layer and the alternating current potential layer, and an orthographic projection of the shielding layer on the substrate covers at least part of the overlapping area.

In an embodiment, an area of the overlapping region covered by the orthographic projection of the shielding layer on the substrate is greater than or equal to 50% of a total area of the overlapping region; or the orthographic projection of the shielding layer on the substrate covers the entire overlapping region.

In an embodiment, the floating potential layer includes a first state and a second state, where in the first state, the floating potential layer is connected to a stable potential, and in the second state, the floating potential layer is in a floating state.

Additional aspects and advantages of the present disclosure will be set forth in part in the following description, which will become apparent from the following description or be learned by practice of the present disclosure.

BRIEF DESCRIPTION OF DRAWINGS

The accompanying drawings, which are incorporated in and constitute a part of this specification, illustrate embodiments consistent with the present disclosure and together with the description serve to explain the principles of the present disclosure.

In the figures.

Figure 1:
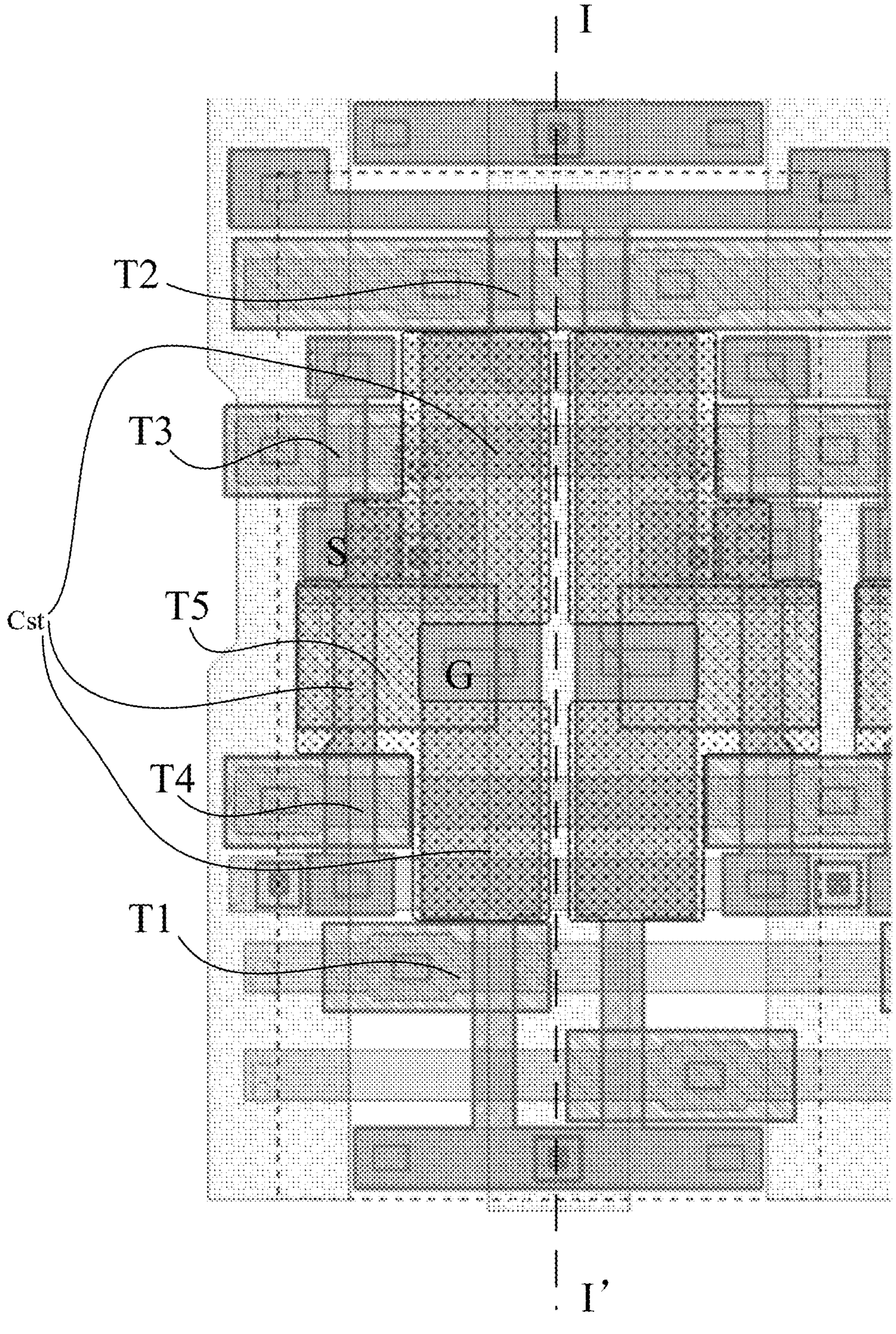
FIG. 1 is a plan view of a pixel driving circuit of a display panel according to some example embodiments of the present disclosure.

1—substrate; 2—buffer layer; 3—active layer; 4—first gate insulating layer; 5—first gate layer; 6—second gate insulating layer; 7—second gate layer; 8—interlayer insulating layer; 9—first source-drain electrode layer; 10—first planarization layer; 11—first passivation layer; 12—second source-drain electrode layer; 13—second passivation layer; 14—second planarization layer; 15—anode; 16—light-emitting layer; 161—pixel-defining layer; 17—cathode.

DETAILED DESCRIPTION

Example embodiments will be described in detail herein, examples of which are illustrated in the accompanying drawings. When the following description refers to the drawings, unless otherwise indicated, same numerals in different drawings indicate same or similar elements. The embodiments described in the following example embodiments do not represent all embodiments consistent with the present disclosure. Rather, they are merely examples of apparatuses and methods consistent with some aspects of the present disclosure as detailed in the appended claims.

The terms used in the present disclosure are for the purpose of describing particular embodiments only and is not intended to limit the present disclosure. As used in the present disclosure and the appended claims, the singular forms "a", "an", and "the" are also intended to include plural forms unless the context clearly indicates other meanings. It should also be understood that the term "and/or" as used herein refers to and encompasses any or all possible combinations of one or more associated listed items.

In the present disclosure, "electrically connected" includes a case in which constituent elements are connected together by an element having an electrical effect. As long as electrical signals between the components that can be connected are received, the "the element having the electrical effect" is not particularly limited. The "the element having the electrical effect" may be, for example, an electrode or a wiring, or a switching element such as a transistor, or other functional elements such as a resistor, an inductor, or a capacitor.

Transistors used in the embodiments of the present disclosure may be thin film transistors or field effect transistors or other devices with same characteristics. Since source and drain electrodes of the thin film transistor are symmetrical, the source and drain electrodes of the thin film transistor are interchangeable. Following examples mainly describe a case of a P-type thin film transistor used as a driving transistor, and other transistors include types same as or different from the driving transistor according to circuit design. Similarly, in other embodiments, the driving transistor may also be illustrated as an N-type thin film transistor.

For those skilled in the art, a pixel refers to a light-emitting unit of a display screen. A pixel typically includes a plurality of sub-pixels of different colors. Pixel density (PPI, Pixels Per Inch) refers to a number of pixels on a display screen per inch. The higher the PPI, the higher the definition.

Ultra-high resolution display technology can improve display effect of a display screen, and can also be applied to a variety of special displays, such as 3D display, in which existing display pixels are divided into a plurality of sub-pixels (Views), each View displays object information of different angles, and the 3D display is realized by using a microlens; for 3D display, the more the number of Views, the better the 3D display effect, and the more the number of Views, the more limited the pixel layout space is, and it is difficult to avoid overlapping between signals in an actual layout process; for a 5T2C (5 transistors and 2 capacitors) compensation circuit or other circuit designs with floating points, for the floating points, overlapping of the graphics, especially overlapping with AC (alternating current) signals, voltage jump of the floating point may be caused, and lighting effect is affected.

Therefore, how to shield interference between alternating current signals while improving space utilization is a problem that needs to be solved urgently in design of a driving circuit layout.

The display panel and the semiconductor device provided by the present disclosure are intended to solve the above technical problems in the prior art.

An embodiment of the present disclosure provides a display panel and a semiconductor device. The display panel and a display apparatus in the embodiments of the present disclosure will be described in detail below with reference to the accompanying drawings. Features in the embodiments described below may complement or be combined with each other on a non-conflict basis.

An embodiment of the present disclosure provides a display panel. The display panel includes a plurality of pixel light-emitting units and a plurality of driving circuits, each pixel light-emitting unit includes an anode 15, a cathode 17 and a light-emitting material located between the anode 15 and the cathode 17, and each driving circuit includes a storage capacitor and a plurality of transistors. The display panel further includes a substrate 1, an active layer 3, a first gate layer 5, a second gate layer 7, and a first source-drain electrode layer 9. The active layer 3 is located on a side of the substrate 1 and includes a plurality of active regions, and the active regions include a fifth active region ACT5; the first gate layer 5 includes a plurality of gate electrodes, an orthographic projection of each gate electrode on the substrate 1 includes an overlapping region with an orthographic projection of a corresponding active region on the substrate 1, and the gate electrode and the active region with the overlapping region are components of a same transistor; a region of the active region overlapping with the gate electrode serves as a channel of the transistor, and regions of the active region located on two sides of the channel serve as a source region and a drain region of the transistor respectively; and the source region or the drain region of one of the active regions is configured to be electrically connected to the anode 15 of the pixel light-emitting unit, the gate electrodes at least include a fifth gate electrode GT5, the fifth gate electrode GT5 is disposed corresponding to the channel of the fifth active region ACT5, and the fifth gate electrode GT5 is configured to be in a floating (raising) state within at least a time period. The gate electrode corresponding to the channel of the active region electrically connected to the anode 15 is configured to be in a floating state for at least one time period. The second gate layer 7 is located on a side of the first gate layer 5 facing away from the active layer 3 and includes a shielding layer; the first source-drain electrode layer 9 is located on a side of the second gate layer 7 facing away from the first gate layer 5 and includes a plurality of power lines arranged side by side, the power lines are configured to input power signals to gate electrodes, source regions or drain regions of the transistors, at least one of the power lines is an alternating current power line, and an orthographic projection of the alternating current power line on the substrate 1 includes an overlapping region with an orthographic projection of the active region electrically connected to the anode 15 on the substrate 1; where an orthographic projection of the shielding layer on the substrate 1 covers at least a part of the overlapping region.

In this embodiment, a partial region of the second gate layer 7 in the driving circuit of the pixel light-emitting unit overlaps with the AC power line in the first source-drain electrode layer 9, so as to achieve signal shielding and noise reduction of the AC signal, thereby preventing the potential of the gate electrode in the floating state from being affected to cause sudden change and poor and uneven display (Mura), thereby improving the display light-emitting effect.

In addition, the AC power line overlaps with a part of wiring of the second gate layer 7, so that a space occupied by each single pixel can be reduced, a space utilization rate can be improved, and an ultra-high-resolution design can be realized.

Figure 10:
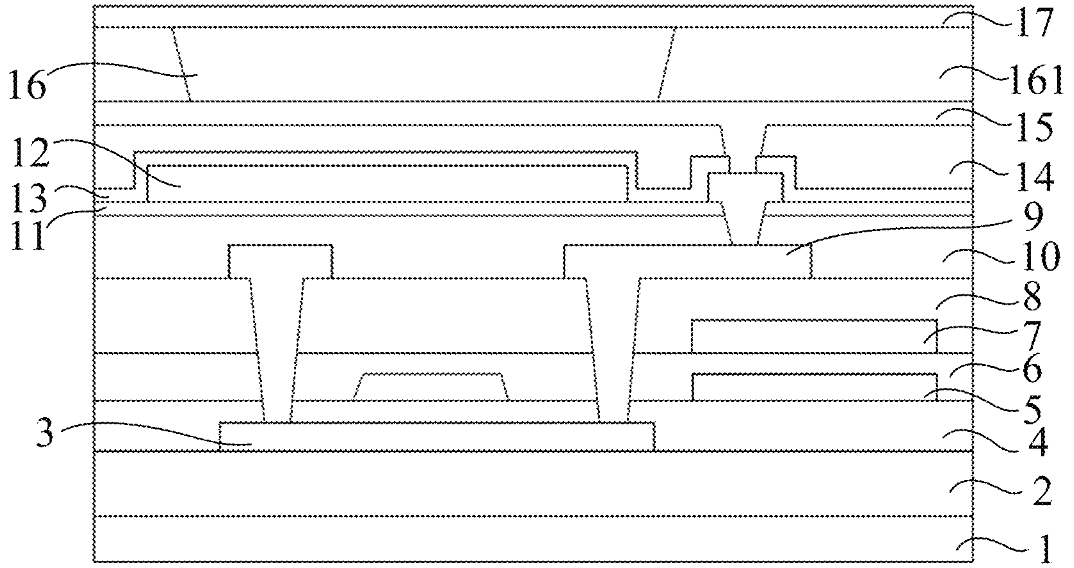
FIG. 10 is a cross-sectional view of a display panel according to some example embodiments of the present disclosure.

In some embodiments, the driving circuits are in one-to-one correspondence with the pixel light-emitting units. Each pixel light-emitting unit realizes light-emitting display under driving of the driving circuit. It should be noted that the driving circuit and the pixel light-emitting unit may be integrated on the substrate 1 through a common semiconductor process. As shown in FIG. 10, the display panel includes a substrate 1, a buffer layer 2, an active layer 3, a first gate insulating layer 4, a first gate layer 5, a second gate insulating layer 6, a second gate layer 7, an interlayer insulating layer 8, a first source-drain electrode layer 9, a first planarization layer 10, a first passivation layer 11, a second source-drain electrode layer, a second passivation layer 13, a second planarization layer 14, an anode 15, a light-emitting layer 16 (pixel-defining layers 161 are disposed at intervals), and a cathode 17 that are sequentially stacked.

It should be noted that the substrate 1 may be a rigid substrate or a flexible substrate, such as glass, quartz, or polyimide (PI). The buffer layer 2 is optional, which may be made of silicon oxide, silicon nitride, silicon oxynitride, or a mixture thereof. The active layer 3 (ACT) may be made of polysilicon (poly). The anode 15 may be made of ITO (Indium Tin Oxide) or IZO (Indium Zinc Oxide), and the cathode 17 may be made of Mg/Ag.

FIG. 1 shows a layout implementation of positions of TFTs and capacitors of a display panel provided by the present embodiment. FIGS. 2-8 are plan views illustrating respective layers of a layout implementation of a sub-pixel. Specifically, FIGS. 2-8 illustrate an implementation of inner-layer wiring or arrangement of semiconductor layers.

Figure 2:
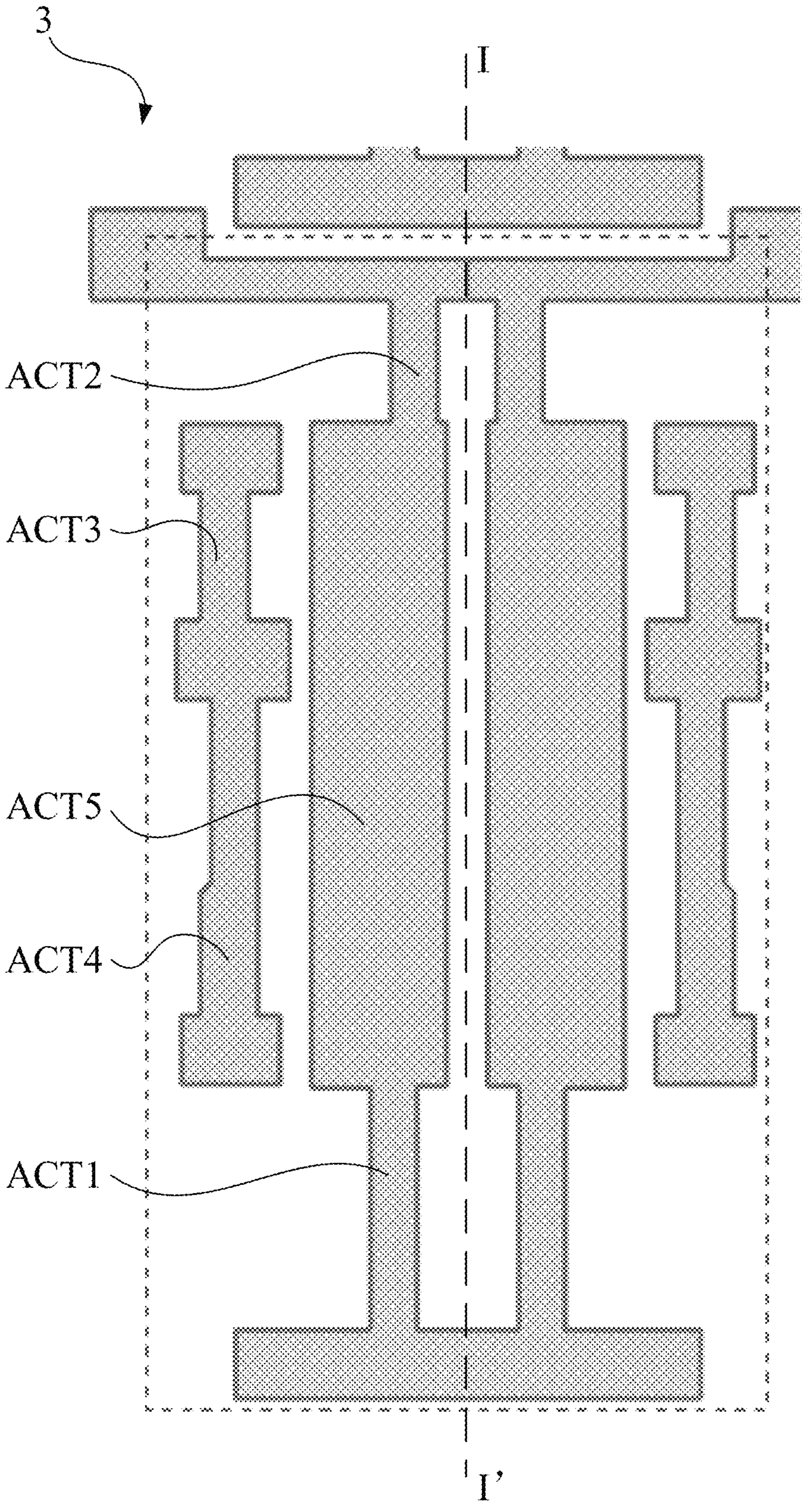
FIG. 2 is a plan view of an active layer of the display panel shown in FIG. 1.
Figure 3:
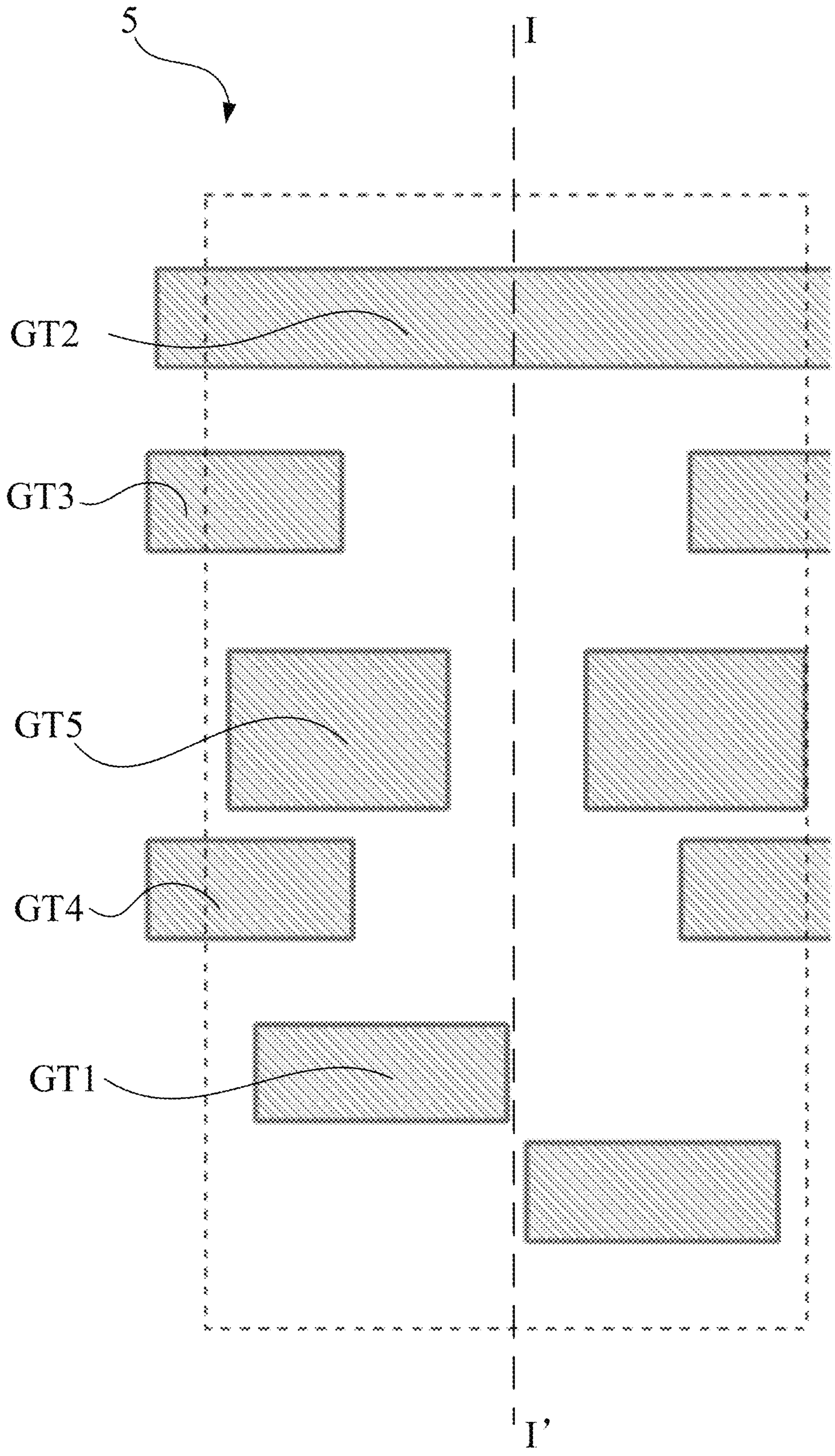
FIG. 3 is a plan view of a first gate layer of the display panel shown in FIG. 1.
Figure 4:
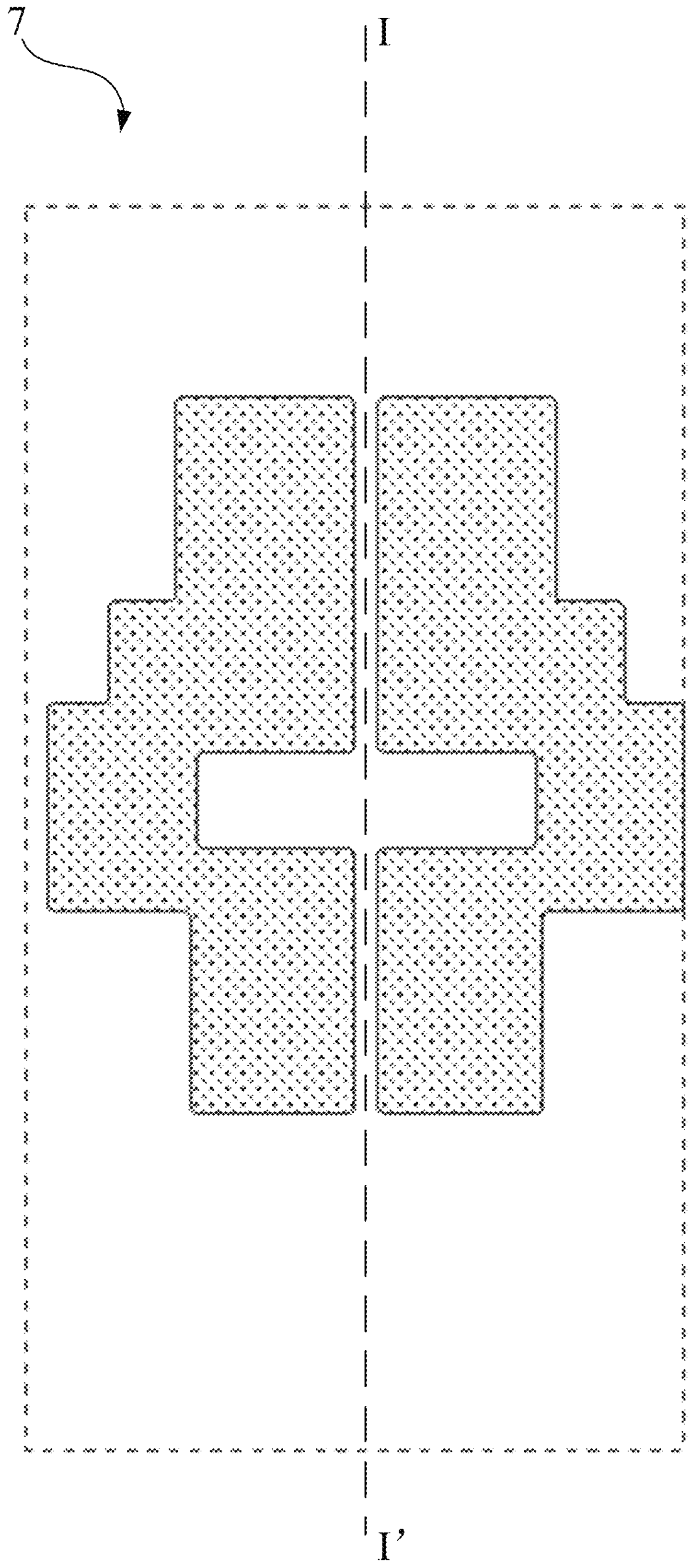
FIG. 4 is a plan view of a second gate layer of the display panel shown in FIG. 1.

In some embodiments, the insulating layer may be located between layer structures in FIGS. 2-8, for example, the first gate insulating layer 4 may be located between the layers in FIGS. 2 and 3, the second gate insulating layer 6 may be located between the layers in FIGS. 3 and 4, and the insulating layer may include a contact hole VH to electrically connect the layer structures in FIGS. 2-8 along a vertical direction.

As shown in FIGS. 1-8, there is a complete 5T2C driving circuit respectively in each of left and right sides, correspondingly including 5 thin film transistors TFT, a storage capacitor Cst and a diode capacitor Coled (not shown). Specifically, the 5 thin film transistors TFT are respectively a first transistor T1, a second transistor T2, a third transistor T3, a fourth transistor T4 and a fifth transistor T5 shown in the figure.

It should be noted that the driving circuit included in the display substrate according to the embodiments of the present disclosure is described herein by taking a 5T2C structure as an example, but the driving circuit included in the display substrate according to the embodiments of the present disclosure is not limited to the 5T2C structure, and may further include 3T1C, 4T1C, 6T1C, 7T1C, and the like.

An active layer 3ACT is located on a side of the substrate 1 and includes a plurality of active regions. Each active region corresponds to one thin film transistor TFT. Specifically, as shown in FIG. 2, active regions included in two driving circuits are symmetrically distributed along a central axis I-I' (same applies to FIGS. 3-8, which will not be repeated hereinafter). For example, the left side corresponds to five active regions included in a 5T2C circuit, which are respectively a first active region ACT1, a second active region ACT2, a third active region ACT3, a fourth active region ACT4 and a fifth active region ACT5, which correspond to a first transistor T2, a second transistor T2, a third transistor T3, a fourth transistor T4 and a fifth transistor T5.

It should be noted that the active regions may include a channel region, a source region and a drain region. The source region and the drain region are respectively located on two sides of the channel region. An orthographic projection of the active layer 3 on the substrate 1 includes an overlapping region with an orthographic projection of the first gate layer 5 on the substrate 1, and the overlapping region forms the channel region.

The first gate insulating layer 4 may cover the active layer 3, or may be a complete layer by itself. A material of the first gate insulating layer 4 may be silicon oxide, silicon nitride, silicon oxynitride or a composite layer thereof.

In some embodiments, an orthographic projection of the first gate insulating layer 4 on the substrate 1 completely covers the first gate layer 5.

The first gate layer 5 is located on a side of the first gate insulating layer 4 facing away from the substrate 1 and includes a plurality of gate electrodes. Specifically, as shown in FIG. 3, the circuit 5T2C on either of the left side or the right side includes 5 gate electrodes, which are a first gate electrode GT1, a second gate electrode GT2, a third gate electrode GT3, a fourth gate electrode GT4 and a fifth gate electrode GT5, which correspond to the first transistor T1, the second transistor T2, the third transistor T3, the fourth transistor T4 and the fifth transistor T5. An orthographic projection of any gate electrode on the substrate 1 includes an overlapping region with a projection of a corresponding one of the active regions on the substrate 1, and the gate electrode and the active region with the overlapping region are components of a same transistor. The first gate electrode GT1 and the corresponding first active region ACT1 constitute a part of the first transistor T1, the second gate electrode GT2 and the corresponding second active region ACT2 constitute a part of the second transistor T2, the third gate electrode GT3 and the corresponding third active region ACT3 constitute a part of the third transistor T3, the fourth gate electrode GT4 and the corresponding fourth active region ACT4 constitute a part of the fourth transistor T4, and the fifth gate electrode GT5 and the corresponding fifth active region ACT5 constitute a part of the fifth transistor T5. It should be noted that the orthographic projection of each active region on the substrate 1 includes an overlapping region with an orthographic projection of each corresponding gate electrode on the substrate 1, the overlapping region forms a channel region of each corresponding thin film transistor, and regions of each active region located on two sides of the channel region are respectively a source region and a drain region of each thin film transistor.

It should be noted that although the first gate layer 5 is shown to be located on a side of the active layer 3 facing away from the substrate 1 (top gate design) in the embodiments of the present disclosure, the first gate layer 5 in the embodiments of the present disclosure may also be designed as a bottom gate or a double gate, that is, the first gate layer 5 may also be located on a side of the active layer 3 facing the substrate 1, or the first gate layer 5 is provided on both sides of the active layer 3 facing the substrate 1 and facing away from the substrate 1. The first gate layer 5 may be set flexibly by those skilled in the art, which is not limited thereto.

Figure 11:
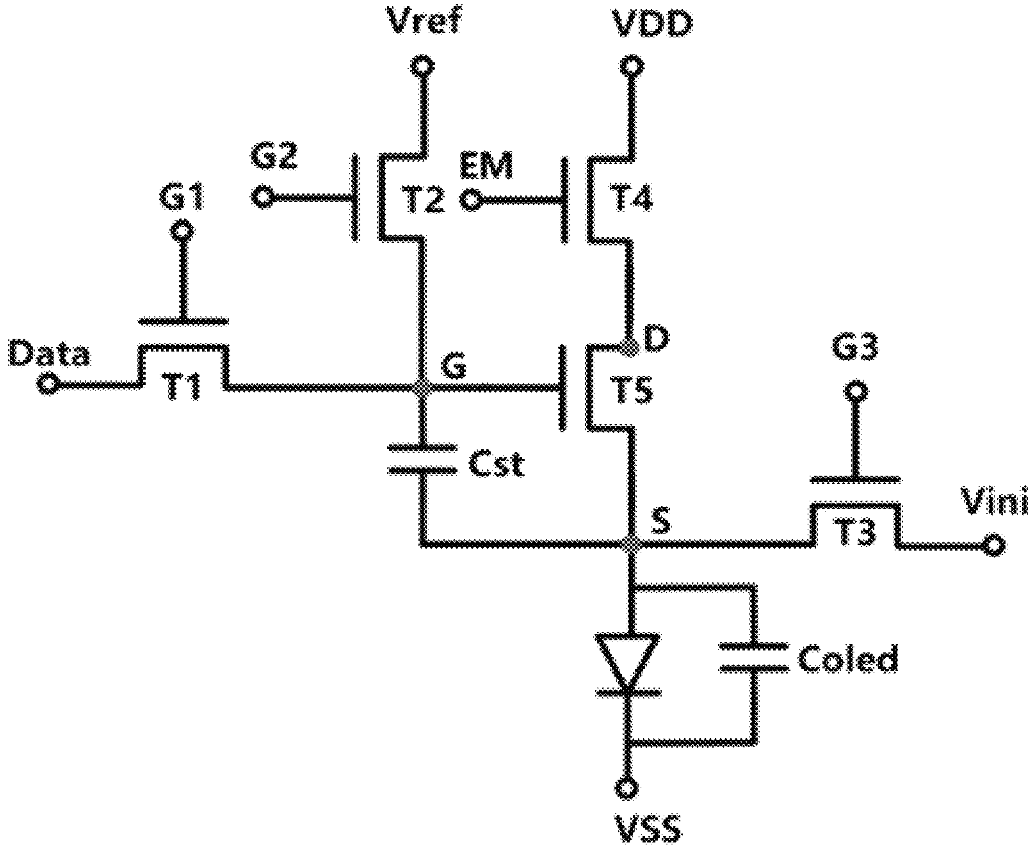
FIG. 11 is a schematic diagram of a pixel driving circuit according to some example embodiments of the present disclosure.
Figure 12:
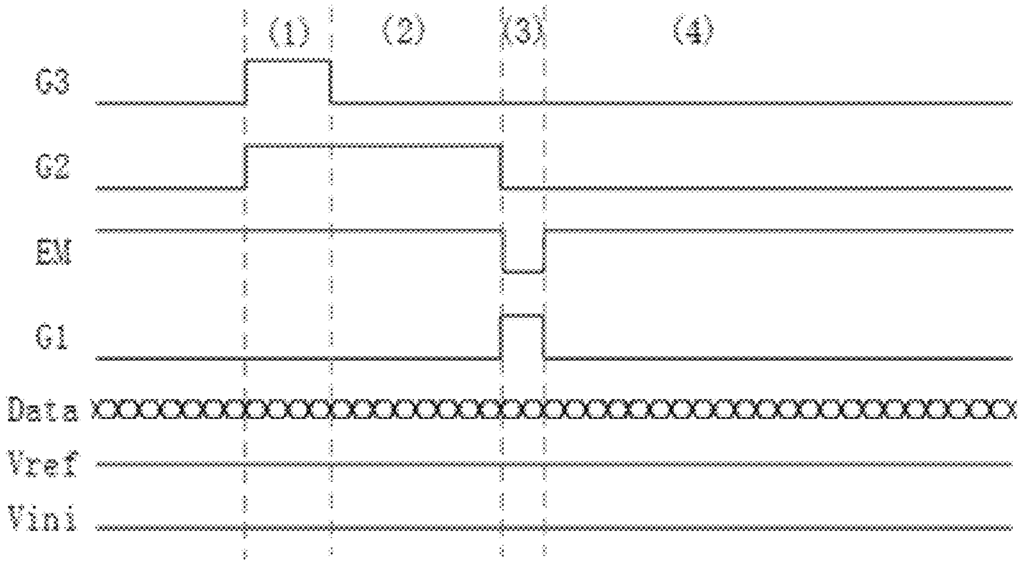
FIG. 12 is an operation timing diagram of a display panel according to some example embodiments of the present disclosure.

In some embodiments, as shown in FIGS. 11-12, the source region or the drain region of the fifth active region ACT5 is configured to be electrically connected to the anode 15 of the pixel light-emitting unit, and the gate electrode corresponding to the channel of the fifth active region ACT5 electrically connected to the anode 15 is configured to be in a floating state within at least one time period of operation of the pixel light-emitting unit.

The second gate layer 7 is located on a side of the first gate layer 5 facing away from the active layer 3, and includes a shielding layer. As shown in FIG. 4, a partial region of the second gate layer 7 forms a capacitor plate of the storage capacitor.

In some embodiments, an area of the overlapping region covered by an orthographic projection of the shielding layer on the substrate 1 is greater than or equal to 50% of a total area of the overlapping region.

In some embodiments, the orthographic projection of the shielding layer on the substrate 1 covers the entire overlapping region.

Figure 9:
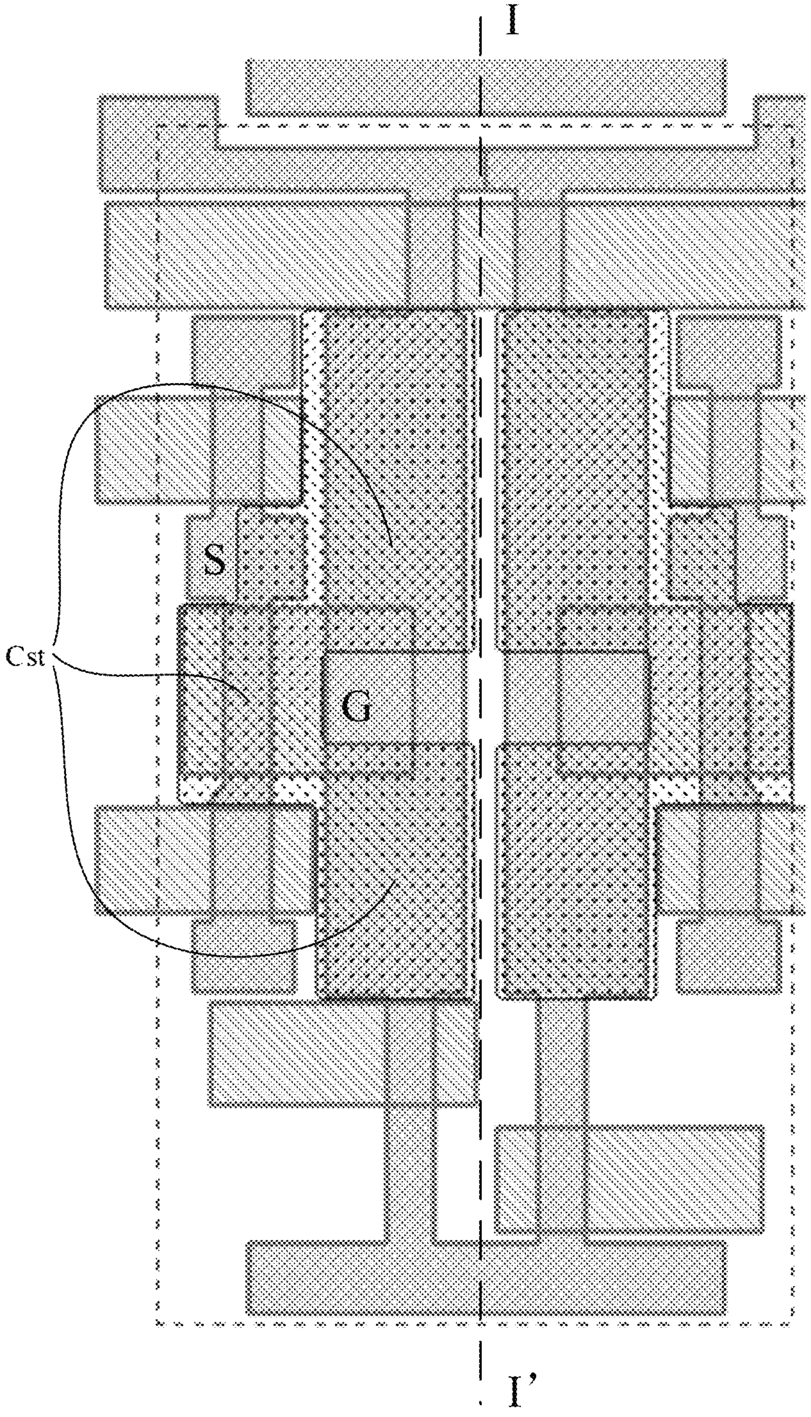
FIG. 9 is a plan view of layers shown in FIGS. 2-4 after being sequentially stacked.

In some embodiments, the shielding layer serves as a capacitor plate of the storage capacitor and is electrically connected to the anode 15; and a region of the active layer 3 located in the overlapping region serves as at least a part of another capacitor plate of the storage capacitor. Thus, the shielding layer and a part of the active layer 3 are combined to form the storage capacitor. Specifically, FIG. 9 is a schematic diagram of layers formed after the active layer 3, the first gate layer 5 and the second gate layer 7 are sequentially stacked, and it can be seen from FIG. 9 that the shielding layer and a partial region of the active layer 3 are combined to form the storage capacitor.

In some embodiments, the plurality of transistors include a first transistor, during a period of time, a source region or a drain region of the first transistor is at a same potential as the fifth gate electrode, and an orthographic projection of an active region of the first transistor on the substrate 1 does not overlap with an orthographic projection of the AC power line on the substrate 1.

In some embodiments, the plurality of transistors include a second transistor, during a period of time, a source region or a drain region of the second transistor is at a same potential as the fifth gate electrode, and an orthographic projection of an active region of the second transistor on the substrate 1 does not overlap with an orthographic projection of the AC power line on the substrate 1.

In some embodiments, as shown in FIG. 11, a source region or a drain region of the first transistor T1, a source region or a drain region of the second transistor T2, the gate electrode of the fifth transistor T5 and a capacitor plate of the storage capacitor Cst are all connected to a potential G; another capacitor plate of the storage capacitor Cst, a source region or a drain region of the fifth transistor T5, a source region or a drain region of the third transistor T3 and the anode 15 are all connected to a potential S; another of the source region or the drain region of the fifth transistor T5 is connected to a source region or a drain region of the fourth transistor T4; a plate of the diode capacitor Coled is connected to the anode 15, and another plate of the diode capacitor Coled is connected to the cathode 17.

Figure 5:
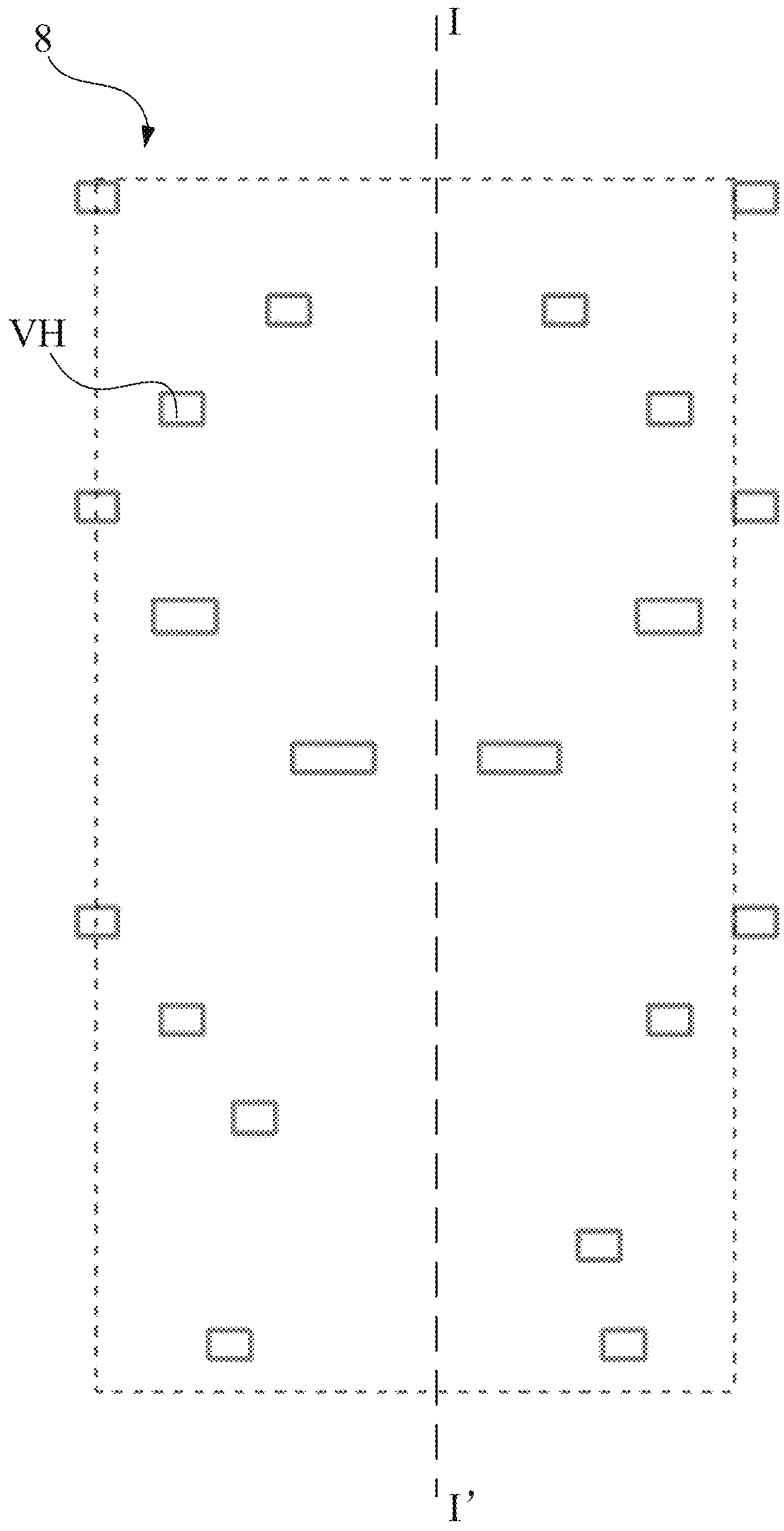
FIG. 5 is a plan view of an interlayer insulating layer of the display panel shown in FIG. 1.

An interlayer insulating layer 8 is located on a side of the second gate layer 7 facing away from the first gate layer 5, as shown in FIG. 5. The interlayer insulating layer 8 includes a plurality of contact holes VH thereon to electrically connect the structures of the layers shown in FIGS. 2-8 along a vertical direction.

Figure 6:
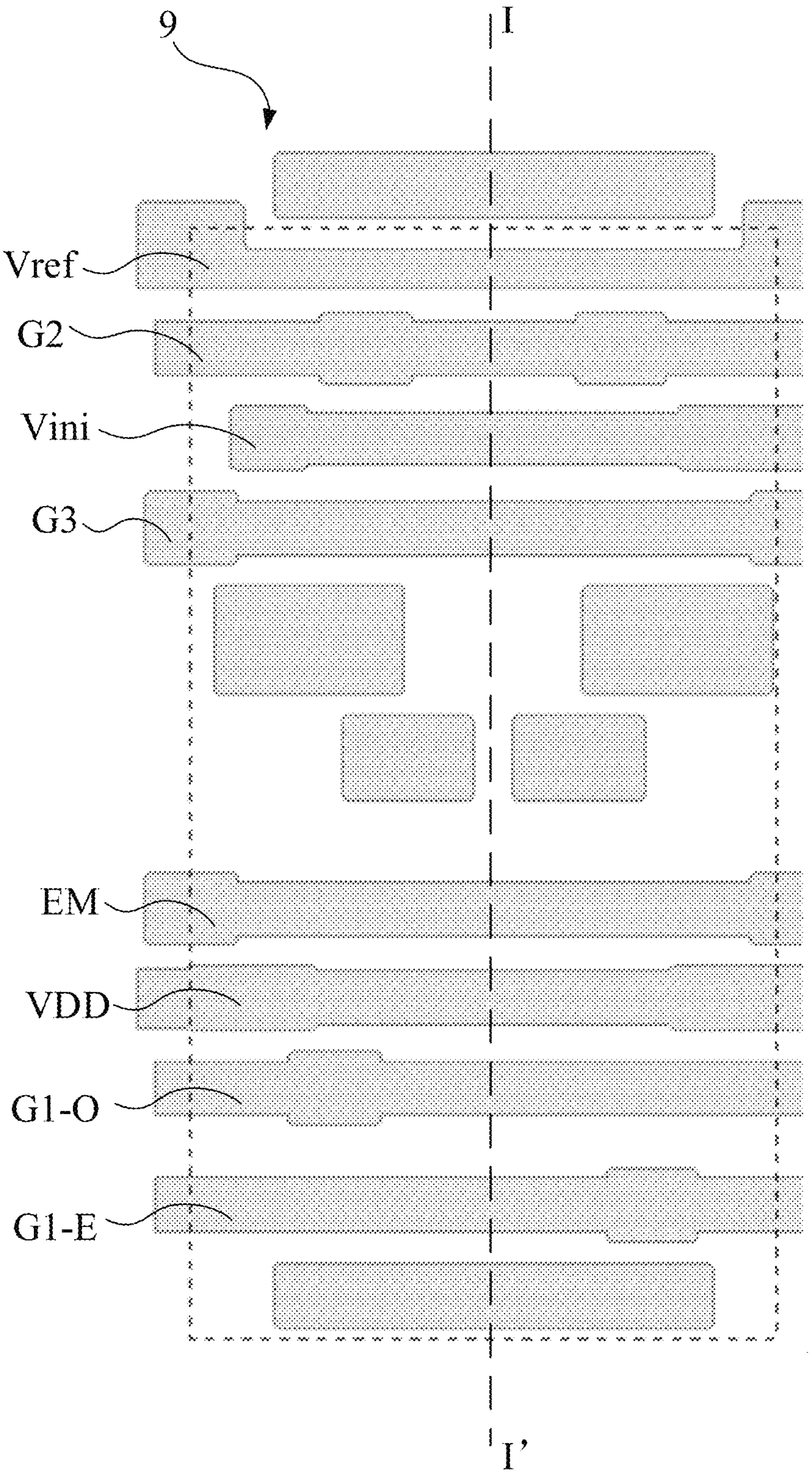
FIG. 6 is a plan view of a first gate-drain electrode layer of the display panel shown in FIG. 1.

As shown in FIG. 6, a first source-drain electrode layer 9 is located on a side of the second gate layer 7 facing away from the first gate layer 5, and includes a plurality of power lines arranged side by side, including a Vref power line, a G2 power line, a Vini power line, a G3 power line, an EM power line, a VDD power line and a G1 power line, and the power lines are configured to input power signals to the gate electrodes, the source regions or the drain regions of the plurality of transistors.

Figure 7:
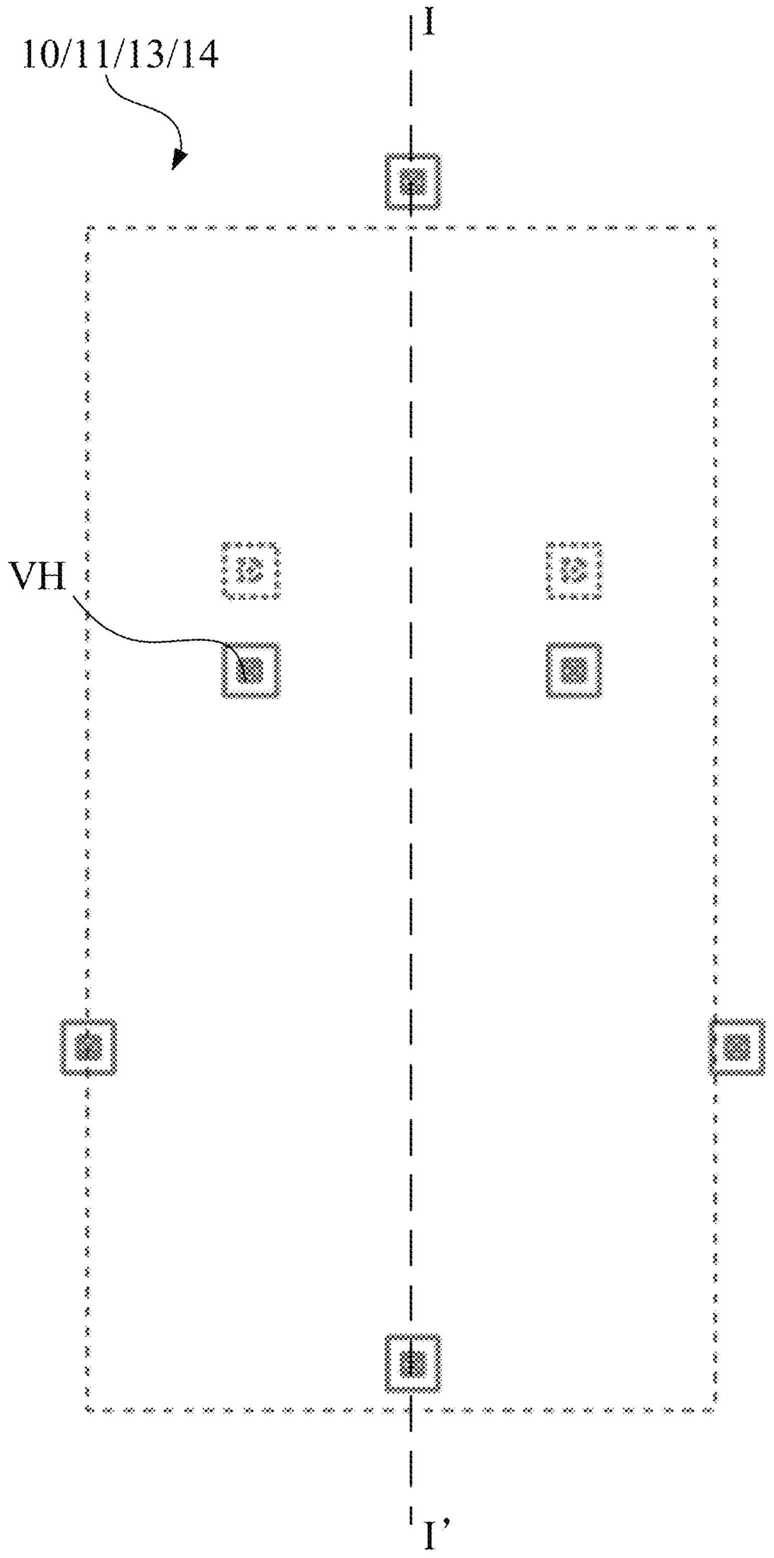
FIG. 7 is a plan view of a first planarization layer/a second planarization layer of the display panel shown in FIG. 1.

In some embodiments, the display panel further includes a first planarization layer 10, a first passivation layer 11, a second passivation layer 13, and a second planarization layer 14, as shown in FIG. 7. The first planarization layer 10, the first passivation layer 11, the second passivation layer 13, and the second planarization layer 14 include a plurality of contact holes VH to electrically connect the layers shown in FIGS. 2-8 along a vertical direction.

Figure 8:
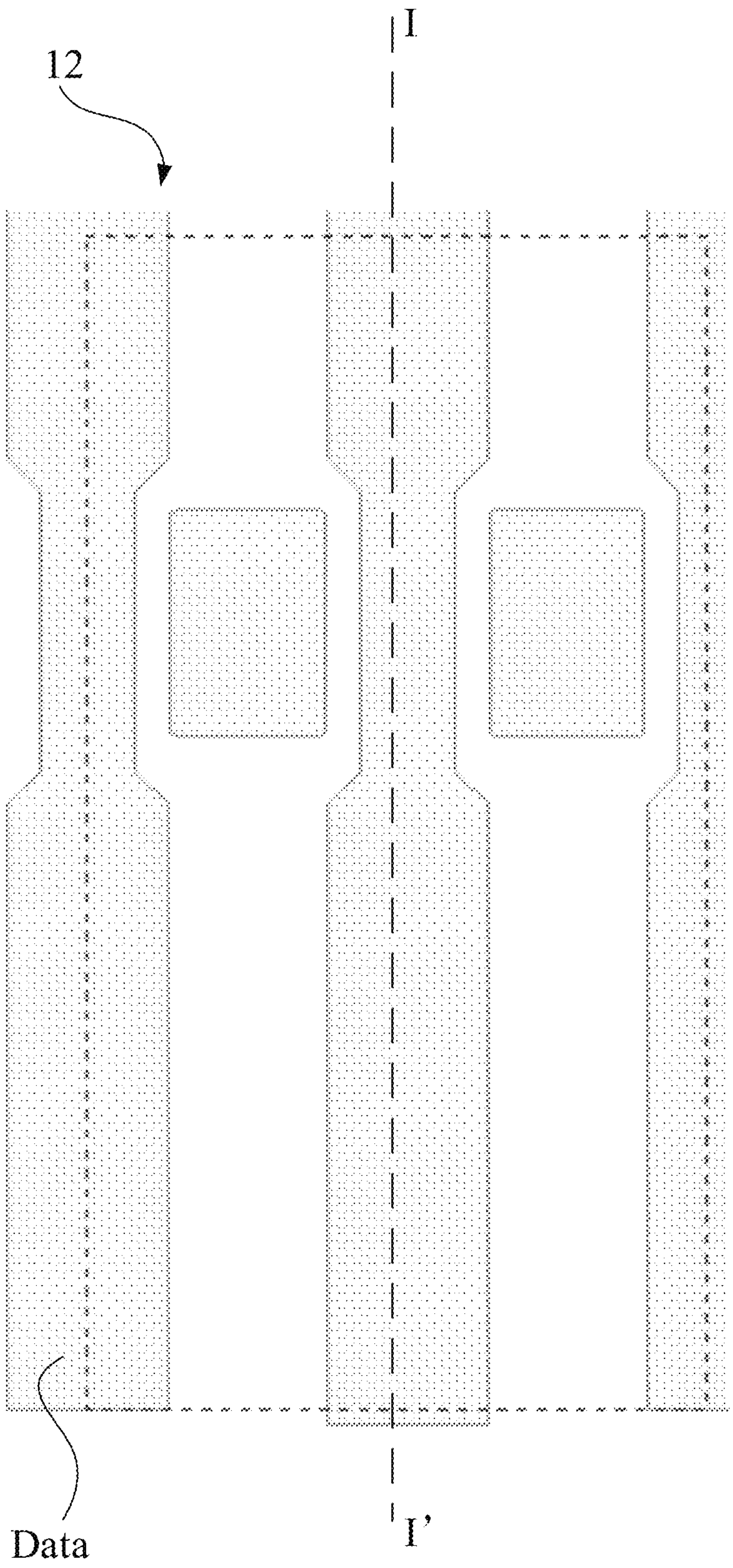
FIG. 8 is a plan view of a second source-drain electrode layer of the display panel shown in FIG. 1.

In some embodiments, the display panel further includes; a second source-drain electrode layer 12, as shown in FIG. 8, the second source-drain electrode layer 12 is located on a side of the first source-drain electrode layer 9 facing away from the second gate layer 7, and includes a plurality of data lines (Data) arranged side by side. The pixel light-emitting units are located on a side of the second source-drain electrode layer 12 facing away from the first source-drain electrode layer 9.

It should be noted that the plurality of data lines extend in a column direction and are configured to provide data signals to pixels in a same column.

In some embodiments, the data lines are electrically connected to the driving circuits; where the data lines are in one-to-one correspondence with the driving circuits.

In some embodiments, there is a one-to-many correspondence between the data line and the driving circuit.

In some embodiments, as shown in FIG. 6, the plurality of power lines include a Vref power line, a G2 power line, a Vini power line, a G3 power line, an EM power line, a VDD power line and a G1 power line, as shown in FIG. 11, the Vref power line is connected to another one of the source region or the drain region of the second transistor T2, the G2 power line is connected to a gate electrode of the second transistor T2, the Vini power line is connected to another one of the source region or the drain region of the third transistor T3, the G3 power line is connected to a gate electrode of the third transistor T3, the EM power line is connected to a gate electrode of the fourth transistor T4, the VDD power line is connected to another one of the source region or the drain region of the fourth transistor T4, and the G1 power line is connected to a gate electrode of the first transistor T1.

In some embodiments, the active region of the transistor where the fifth gate electrode GT5 is located extends along a column direction, and the plurality of power lines extend along a row direction. As shown in FIG. 2, the gate electrode of the fifth transistor T5 is in a floating state during at least one time period of operation of the pixel light-emitting unit, and the fifth active region ACT5 corresponding to the fifth transistor T5 extends along the column direction, and the plurality of power lines including a Vref power line, a G2 power line, a Vini power line, a G3 power line, an EM power line, a VDD power line, and a G1 power line all extend along the row direction.

As shown in FIGS. 11-12, the display panel provided by the present embodiment achieves compensation through following four stages.

In a first stage (reset stage), the second transistor T2 is controlled to be turned on under control of a high level signal of the power line G2, and the third transistor T3 is controlled to be turned on under control of a high level signal of the power line G3, thus reset is implemented.

In a second stage (compensation phase), the second transistor T2 is controlled to remain at an on-state under control of the high level signal of the power line G2, so that the node G is remained at a voltage Vref, and meanwhile, the power line G3 is controlled to shift from a high level to a low level, so that the third transistor T3 is turned off. The fifth transistor T5 is turned on to charge the node S until Vgs=Vth, Vth data of the fifth transistor T5 is stored at the node S, and the voltage at the node S becomes Vref-Vth, that is, voltage compensation is performed on the fifth transistor T5.

In a third stage (data-writing phase), the power line G2 is shifted from a high level to a low level to turn off the second transistor T2. The G1 power line is shifted from a low level to a high level to turn on the first transistor T1, and a data line writes a data signal to the node G through a gate electrode of the first transistor T1.

In a fourth stage (light-emitting stage), all transistors are turned off, and the storage capacitor Cst charges the node S, thus the node G is in a floating state, and a voltage of the node S is floating upward; since the storage capacitor Cst exists between the node S and the node G, the voltage of the node G is also floating accordingly. A potential of the node S is connected to the anode 15 of the OLED, and when the node S is floating to the voltage of the anode 15, the storage capacitor Cst between the node G and the node S is coupled to the node G to cause the node G to be floating, and the node G and the node S are floating to remain the Vth voltage of the fifth transistor T5, that is, a grayscale voltage required in the light-emitting stage.

Therefore, when the potential of the node G is pulled down due to the coupling between the node G and the AC signal, the voltage of the fifth transistor T5 will be affected, and thus the grayscale voltage cannot be achieved, thereby affecting the light-emitting effect. Therefore, in this embodiment, the shielding region is additionally arranged on the second gate layer 7 to shield the alternating current signal, thereby avoiding influence of the alternating current signal on the potential at the node G.

The embodiments of the present disclosure further provides a semiconductor device, and the semiconductor device includes a substrate 1, a floating potential layer, an alternating current potential layer and a shielding layer, where the floating potential layer is arranged on one side of the substrate 1; the alternating current potential layer is connected with an alternating current power and is arranged on a side of the potential floating layer facing away from the substrate 1, and an orthographic projection of the alternating current potential layer on the substrate 1 includes an overlapping region with an orthographic projection of the floating potential layer on the substrate 1; and the shielding layer is arranged between the floating potential layer and the alternating current potential layer, and an orthographic projection of the shielding layer on the substrate 1 covers at least part of the overlapping area.

In some embodiments, an area of the overlapping region covered by the orthographic projection of the shielding layer on the substrate 1 is greater than or equal to 50% of a total area of the overlapping region; or, the orthographic projection of the shielding layer on the substrate 1 covers the entire overlapping region.

In some embodiments, the floating potential layer includes a first state and a second state, in the first state, the floating potential layer is connected to a stable potential, and in the second state, the floating potential layer is in a floating state.

The shielding layer in this embodiment operates according to a same principle as the shielding layer in the display panel of the above embodiments. Therefore, the semiconductor device has all features and advantages similar to those of the above display panel, and details will not be repeated herein.

It should be noted that the display apparatus may be any device that displays texts or images no matter moving (e.g., video) or fixed (e.g., still image). More particularly, it is expected that the embodiments may be implemented in or associated with a variety of electronic devices such as, but not limited to, a mobile phone, a wireless device, a personal data assistant (PDA), a handheld or portable computer, a GPS receiver navigator, a camera, a MP4 video player, a video camera, a game console, a watch, a clock, a calculator, a television monitor, a flat panel display, a computer monitor, an automotive display (e.g., an odometer display, etc.), a navigator, a cockpit controller and/or display, a display of a camera view (e.g., a display of a rear view camera in a vehicle), an electronic photograph, an electronic billboard or sign, a front projector, a building structure, a package, an aesthetic structure (e.g., a display of an image for a piece of jewelry), etc.

The above embodiments of the present disclosure may be supplemented to each other on a non-conflict basis.

It should be noted that in the drawings, dimensions of layers and regions may be exaggerated for clarity of illustration. Also, it is understood that when an element or layer is referred to as being "on" another element or layer, it may be directly on the other element, or intervening layers may be presented therebetween. Additionally, it is understood that when an element or layer is referred to as being "under" another element or layer, it may be directly under the other element, or more than one intervening layer or element may be presented therebetween. Additionally, it will be understood that when a layer or element is referred to as being "between" two layers or elements, it may be the only layer between two layers or elements, or more than one intermediate layer or element may also be presented therebetween. Same reference numerals indicate same elements throughout.

The orientation or positional relationship indicated by the terms "center", "upper", "lower", "front", "rear", "left", "right", "vertical", "horizontal", "top", "bottom", "inner", "outer" and the like is based on the orientation or positional relationship shown in the drawings, and is only for the convenience of describing the present application and simplifying the description, rather than indicating or implying that the referred device or element must have a specific orientation, be constructed and operated in a specific orientation, and therefore cannot be understood as a limitation on the present disclosure.

The terms "first" and "second" are used for descriptive purposes only, and cannot be understood as indicating or implying relative importance or implicitly indicating the number of technical features indicated. Thus, features defining "first" and "second" may explicitly or implicitly include one or more of the features. In the description of the present disclosure, unless otherwise specified, "a plurality of" means two or more.

Other embodiments of the present disclosure will be readily apparent to those skilled in the art upon consideration of the specification and practice of the disclosure disclosed herein. The present disclosure is intended to cover any variations, uses, or adaptations of the present disclosure that follow the general principles of the present disclosure and include common knowledge or conventional technical means in the art that is not disclosed in the present disclosure. The specification and examples are to be regarded as examples only, and the true scope and spirit of the present disclosure are indicated by the claims.

It should be understood that the present disclosure is not limited to the precise structure described above and shown in the accompanying drawings, and various modifications and changes may be made without departing from the scope thereof. The scope of the present disclosure is limited only by the appended claims.

The invention claimed is:

1. A display panel, comprising pixel light-emitting units and driving circuits, wherein each of the pixel light-emitting units comprises an anode, a cathode and a light-emitting material between the anode and the cathode, each of the driving circuits comprises a storage capacitor and transistors; wherein the display panel comprises:

a substrate;

an active layer located on a side of the substrate and comprising active regions, wherein the active regions comprise a fifth active region;

a first gate layer, comprising gate electrodes, wherein an orthographic projection of each of the gate electrodes on the substrate comprises an overlapped region with an orthographic projection of a corresponding active region on the substrate, and the gate electrode and the active region with the overlapped region constitute a part of a same transistor; a region of the active region overlapped with the gate electrode serves as a channel of the transistor, and regions of the active region on two sides of the channel serve as a source region and a drain region of the transistor respectively; wherein a source region or a drain region of one of the active regions is configured to be electrically connected to the anode of one of the pixel light-emitting units, the gate electrodes at least comprise a fifth gate electrode, and the fifth gate electrode is configured to correspond to a channel of the fifth active region and is configured to be in a floating state within at least one time period;

a second gate layer, located on a side of the first gate layer facing away from the active layer, and comprising a shielding layer; and a first source-drain electrode layer, located on a side of the second gate layer facing away from the first gate layer, and comprising power lines, wherein the power lines are configured to input power signals to the gate electrodes, source regions or drain regions of the transistors, and at least one of the power lines is an alternating current power line, and an orthographic projection of the alternating current power line on the substrate comprises an overlapping region with an orthographic projection of the one of the active regions electrically connected to the anode on the substrate;

wherein an orthographic projection of the shielding layer on the substrate covers at least a part of the overlapping region.

2. The display panel according to claim 1, wherein an area of the overlapping region covered by the orthographic projection of the shielding layer on the substrate is greater than or equal to 50% of a total area of the overlapping region; or the orthographic projection of the shielding layer on the substrate covers the entire overlapping region.

3. The display panel according to claim 1, wherein the shielding layer serves as a capacitor plate of the storage capacitor and is electrically connected to the anode; and a region of the active layer located in the overlapping region serves as at least a part of another capacitor plate of the storage capacitor.

4. The display panel according to claim 1, wherein the transistors comprise a first transistor, a source region or a drain region of the first transistor is at a same potential as the fifth gate electrode within a time period, and an orthographic projection of an active region of the first transistor on the substrate does not overlap with the orthographic projection of the alternating current power line on the substrate.

5. The display panel according to claim 1, further comprising:

a second source-drain electrode layer, located on a side of the first source-drain electrode layer facing away from the second gate layer, and comprising data lines arranged side by side; and the pixel light-emitting units are located on a side of the second source-drain electrode layer facing away from the first source-drain electrode layer.

6. The display panel according to claim 1, wherein an active region of a transistor where the fifth gate electrode is located extends along a column direction, and the power lines extend along a row direction.

7. The display panel according to claim 1, wherein the driving circuits comprise a first transistor, a second transistor, a third transistor, a fourth transistor, a fifth transistor, a storage capacitor and a diode capacitor;

a source region or a drain region of the first transistor, a source region or a drain region of the second transistor, a gate electrode of the fifth transistor and a capacitor plate of the storage capacitor are all connected to a first potential; another capacitor plate of the storage capacitor, a source region or a drain region of the fifth transistor, a source region or a drain region of the third transistor and the anode are all connected to a second potential; another of the source region or the drain region of the fifth transistor is connected to a source region or a drain region of the fourth transistor; a plate of the diode capacitor is connected to the anode, and another plate of the diode capacitor is connected to the cathode.

8. The display panel according to claim 7, wherein the power lines comprise a first power line, a second power line, a third power line, a fourth power line, a fifth power line, a sixth power line and a seventh power line, wherein the first power line is connected to another of the source region or the drain region of the second transistor, the second power line is connected to a gate electrode of the second transistor, the third power line is connected to another of the source region or the drain region of the third transistor, the fourth power line is connected to a gate electrode of the third transistor, the fifth power line is connected to a gate electrode of the fourth transistor, the sixth power line is connected to another of the source region or the drain region of the fourth transistor, and the seventh power line is connected to a gate electrode of the first transistor.

9. The display panel according to claim 5, wherein the data lines are electrically connected to the driving circuits; wherein the data lines are in one-to-one correspondence with the driving circuits; or the data lines are in one-to-many correspondence with the driving circuits.

10. The display panel according to claim 1, further comprising: a first gate insulating layer disposed between the active layer and the first gate layer, and an interlayer insulating layer disposed between the first source-drain layer and the active layer;

an orthographic projection of the first gate insulating layer on the substrate completely covers the first gate layer.

11. A semiconductor device, comprising:

a substrate;

a floating potential layer, disposed on a side of the substrate;

an alternating current potential layer, connected to an alternating current power and disposed on a side of the floating potential layer facing away from the substrate, wherein an orthographic projection of the alternating current potential layer on the substrate comprises an overlapping region with an orthographic projection of the floating potential layer on the substrate;

a shielding layer, disposed between the floating potential layer and the alternating current potential layer, wherein an orthographic projection of the shielding layer on the substrate covers at least a part of the overlapping region.

12. The semiconductor device according to claim 11, wherein an area of the overlapping region covered by the orthographic projection of the shielding layer on the substrate is greater than or equal to 50% of a total area of the overlapping region; or the orthographic projection of the shielding layer on the substrate covers the entire overlapping region.

13. The semiconductor device according to claim 11, wherein the floating potential layer comprises a first state and a second state, wherein in the first state, the floating potential layer is connected to a stable potential, and in the second state, the floating potential layer is in a floating state.

14. The semiconductor device according to claim 1, wherein the transistors comprise a second transistor, a source region or a drain region of the second transistor is at a same potential as the fifth gate electrode within a time period, and an orthographic projection of an active region of the second transistor on the substrate does not overlap with the orthographic projection of the alternating current power line on the substrate.

* * * * *